United States Patent [19]

Honda

[11] Patent Number: 5,434,923
[45] Date of Patent: Jul. 18, 1995

[54] ACOUSTIC APPARATUS

[75] Inventor: Takashi Honda, Kokubunji, Japan

[73] Assignee: Kabushiki Kaisha Kenwood, Tokyo, Japan

[21] Appl. No.: 198,386

[22] Filed: Feb. 18, 1994

Related U.S. Application Data

[63] Continuation of Ser. No. 77,955, Jun. 18, 1993, abandoned, which is a continuation of Ser. No. 740,401, Aug. 5, 1991, abandoned.

[30] Foreign Application Priority Data

Aug. 7, 1990 [JP]  Japan ................... 2-207558

[51] Int. Cl.6 .................. H03G 3/00; H03G 5/00
[52] U.S. Cl. ........................ 381/63; 381/98
[58] Field of Search .......... 381/98, 63, 103, 120; 455/346, 349

[56] References Cited

U.S. PATENT DOCUMENTS

| | | |
|---|---|---|
| 4,297,730 | 10/1981 | Kadowaki et al. . |
| 4,405,836 | 9/1983 | Meyerhoff . |
| 4,461,026 | 7/1984 | Priniski ................... 381/98 |
| 4,464,781 | 8/1984 | Kaneko et al. ........... 381/98 |
| 4,495,640 | 1/1985 | Frey ........................ 381/98 |
| 4,504,968 | 3/1985 | Kaneko et al. ........... 381/103 |
| 4,706,291 | 11/1987 | Kakubo et al. .......... 381/63 |
| 4,903,307 | 2/1990 | Ozawa et al. ............ 381/103 |
| 5,040,220 | 8/1991 | Iwamatsu ................. 381/63 |

FOREIGN PATENT DOCUMENTS

| | | |
|---|---|---|
| 0343958 | 11/1989 | European Pat. Off. . |
| 59-047820 | 3/1984 | Japan . |
| 61-084200 | 10/1984 | Japan . |
| 63-177698 | 10/1986 | Japan . |

Primary Examiner—Forester W. Isen
Attorney, Agent, or Firm—Sixbey, Friedman, Leedom & Ferguson; Gerald J. Ferguson, Jr.; Evan R. Smith

[57] ABSTRACT

In an acoustic reproduction system, an audio signal obtained from a source is ornamented by a sound processing pattern such as reflecting and reverberating sounds and then the sound processed audio signal is reproduced through a selected equalizing frequency curve. In particular, a plurality of equalizing curves are respectively stored in association with a plurality of predetermined specific sound processing patterns. Thus, the equalizer in response to the selected sound processing pattern automatically determines a equalizing curve corresponding to the selected sound processing pattern.

3 Claims, 3 Drawing Sheets

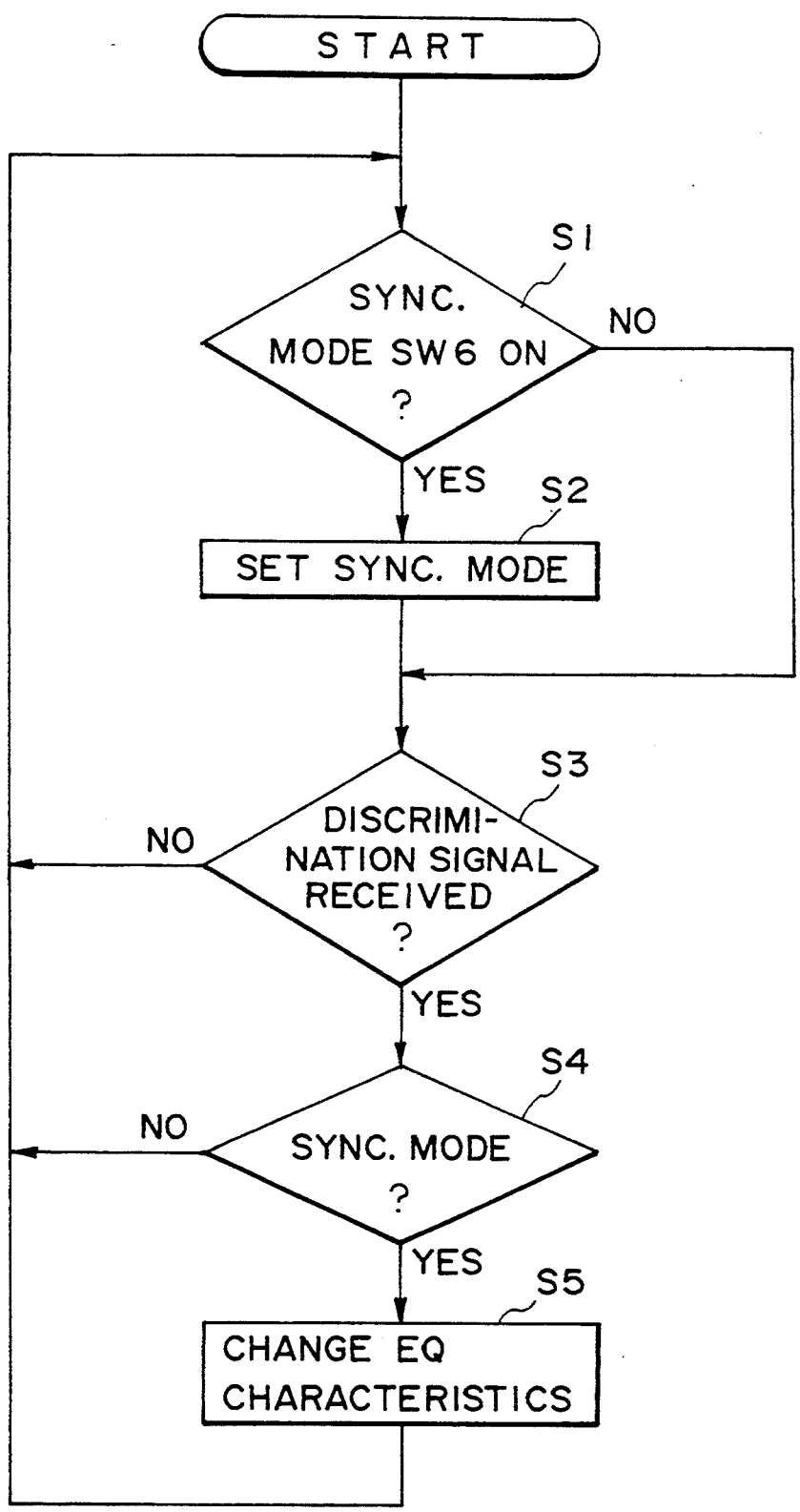
F I G. 2

ACOUSTIC APPARATUS

This application is a Continuation of Ser. No. 08/077,955, filed Jun. 18, 1993, now abandoned, which was a Continuation of Ser. No. 07/740,401, filed Aug. 5, 1991, now abandoned.

BACKGROUND OF THE INVENTION 1. (Field of the Invention)

The present invention relates to an acoustic apparatus having an amplifier with a digital signal processor and a graphic equalizer for equalizing an output signal from the amplifier, and more particularly to an acoustic apparatus capable of controlling the equalizing characteristics of a graphic equalizer synchronously with a selected sound field processing pattern of the digital signal processor.

2. (Description of the Related Background Art)

The related background art will be described with reference to FIG. 3.

In FIG. 3, reference numeral 1 represents an amplifier, 1a represents a digital signal processor (hereinafter abbreviated as DSP), 1b represents a key input unit (SW) having key switches, 1c represents a display for displaying the operating characteristics of DSP 1a upon instruction from the key input unit 1b, and 1d represents a microcomputer for controlling the amplifier 1.

DSP 1a generates initial reflecting sounds and reverberating sounds for an input signal S1. The generated initial reflecting and reverberating sounds are added to the input signal S1, and various parameters are set to obtain various sound fields. The parameters include the time and level of initial reflecting sounds, and the level and density of reverberating sounds, and the like. The amplifier 1 outputs a signal S2 representative of each sound field thus generated.

Sound fields capable of being set in the above manner include, for example, a sound field for a large orchestra hall, a sound field for an arena theater, a sound field for a church, a sound field for a jazz or live music hall, a sound field for a disco club with strong echo and dynamic low sounds, a sound field for an outdoor stadium for live concert with accommodations of several tens thousands of people, and other sound fields. A sound field processing pattern data 1e set as above is stored in a memory within DSP 1a. A desired sound field processing pattern data 1e can be selected by a key input from the key input unit 1b. The characteristics and other data of the selected sound processing pattern data are displayed on the display 1c.

Reference numeral 2 represents a graphic equalizer for equalizing the output signal S2 from the amplifier 1, 2a represents an equalizer unit of the graphic equalizer 2, 2b represents a key input unit for entering an instruction to the graphic equalizer 2, 2c represents a display for displaying the equalizing characteristics of the equalizer unit 2a, and 2d represents a microcomputer for controlling the graphic equalizer 2. A plurality of present data 2e representative of the equalizing characteristics are stored in a RAM within the microcomputer 2d.

Within the above-described acoustic apparatus, selecting a sound field processing pattern data 1e from DSP 1a is performed independently from adjusting the equalizer unit 2a, resulting in complicated manipulation problem by an operator.

SUMMARY OF THE INVENTION

The present invention has been made in consideration of the above problem. It is therefore an object of the present invention to provide an acoustic apparatus having an improved operability and capable of readily obtaining an optimum sound field effect and sound effect.

According to an aspect of the present invention, there is provided an acoustic apparatus comprising:

an amplifier having a digital signal processor; and a graphic equalizer for equalizing an output signal of the amplifier, the digital signal processor having a memory for storing a plurality of sound field processing patterns, and the graphic equalizer having a memory for storing a plurality of equalizing characteristics, wherein when one of the plurality of sound field processing patterns set in the amplifier is selected, the graphic equalizer selects an equalizing characteristic in accordance with the selected sound field processing pattern, and the output signal of the amplifier is equalized by the selected equalizing characteristic.

According to the present invention, when one of a plurality of sound field processing patterns set in the amplifier is selected, the amplifier sends a discrimination signal representative of the selected sound field processing pattern to the graphic equalizer.

The graphic equalizer checks the contents of the discrimination signal. In accordance with the contents of the discrimination signal, the corresponding equalizing characteristic is selected to equalize the output signal of the amplifier.

BRIEF DESCRIPTION OF THE DRAWINGS

FIG. 2 is a flow chart illustrating the operation of the acoustic apparatus shown in FIG. 1.

DETAILED DESCRIPTION OF THE EMBODIMENT

Figure 3:
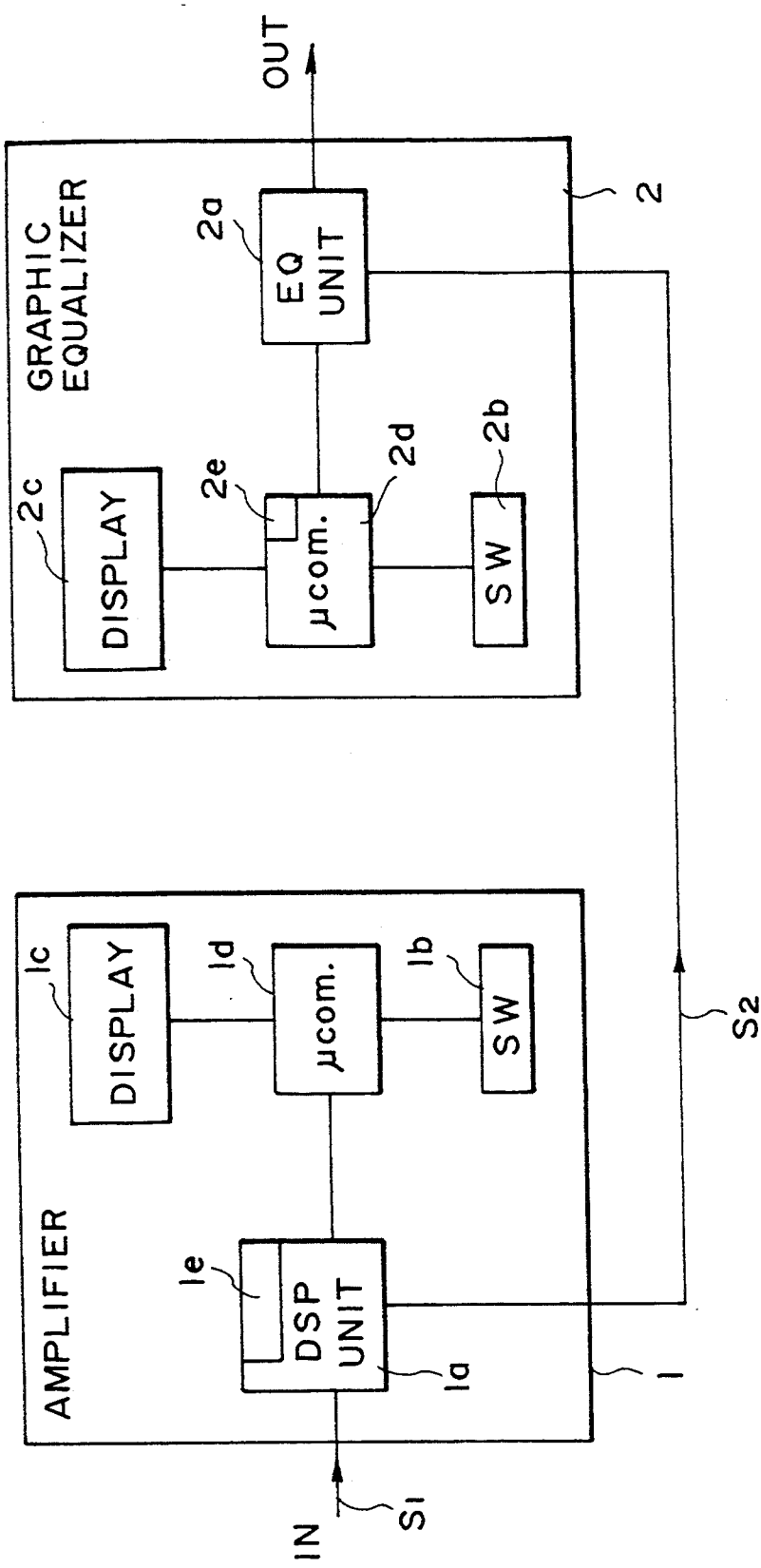
FIG. 3 is a block diagram showing the structure of a conventional acoustic apparatus.

A preferred embodiment of the acoustic apparatus of the present invention will be described with reference to FIG. 1 and 2. Like elements to those shown in FIG. 3 are represented by using identical reference numerals, and the description thereof is omitted.

Figure 1:
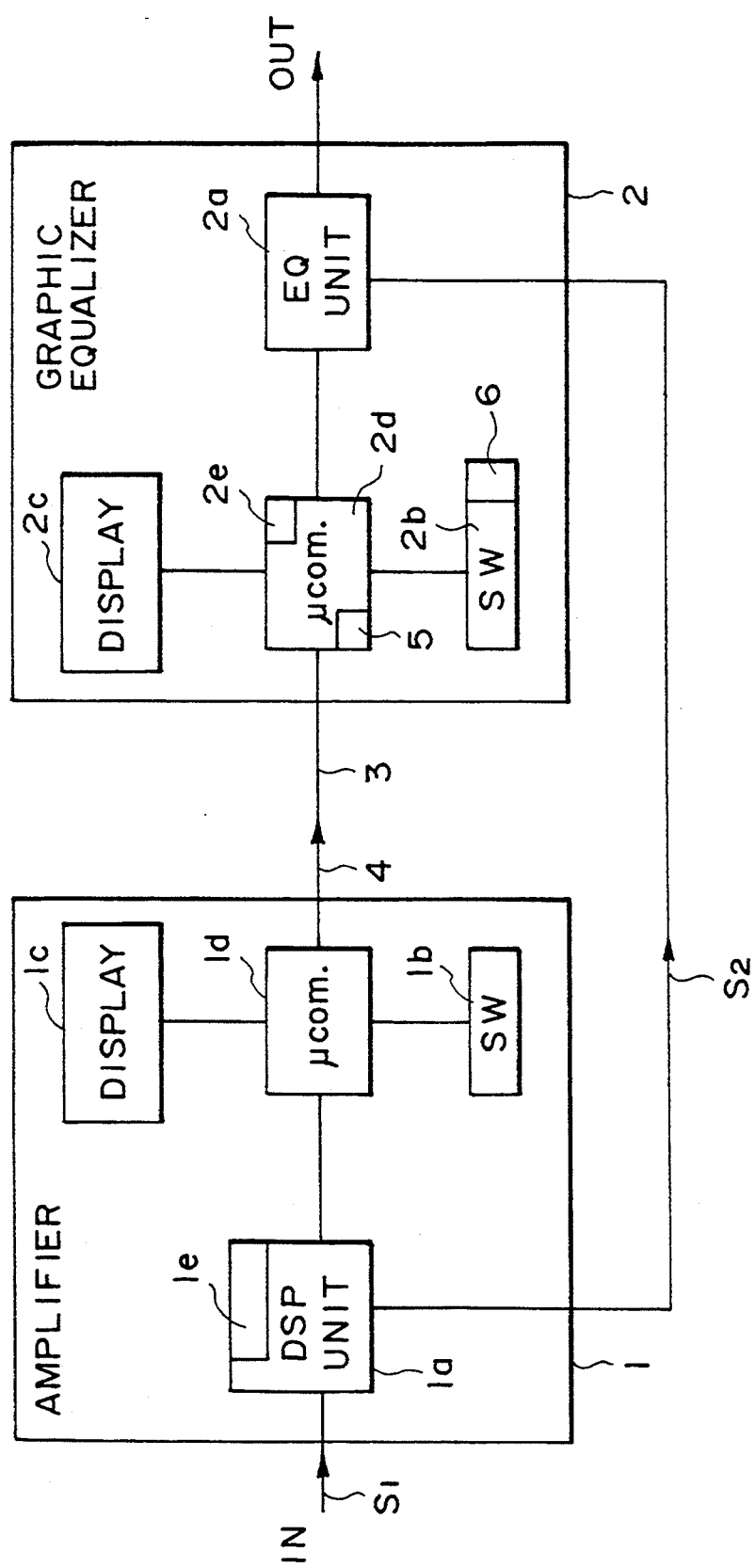
FIG. 1 is a block diagram showing the structure of an acoustic apparatus according to an embodiment of the present invention.

Referring to FIG. 1, reference numeral 3 represents a communication line interconnecting a microcomputer 1d and a microcomputer 2d of a graphic equalizer 2. A discrimination signal indicated at 4 is used for discriminating a sound field processing pattern 1e sent from the amplifier 1 to the graphic equalizer 2. Reference numeral 5 represents a sound field processing pattern discriminating means provided on the side of the 20 graphic equalizer 2, the discriminating means discriminating the contents of the discrimination signal 4. Reference numeral 6 represents a synchronous mode switch provided on the side of the graphic equalizer 2, the synchronous mode switch enabling to execute the characteristic function of the present invention.

The operation of the acoustic apparatus of the present invention will be described with reference to the flow chart of FIG. 2.

When a desired sound field processing pattern data 1e is selected upon a key input from the key input unit 1b of the amplifier 1, a corresponding indication is displayed on the display 1c. Next, the amplifier 1 sends a discrimination signal 4 for discriminating the selected sound field processing pattern data over the communication line 3.

By this time, the graphic equalizer 2 has been preset to execute the characteristic function of this invention by turning the synchronous mode switch 6 on (steps S1 and S2). Therefore, upon reception of the discrimination signal 4 (step S3), the graphic equalizer 2 checks the contents of the discrimination signal 4. In accordance with the contents of the discrimination signal, the corresponding equalizing characteristic data 2e is called and set to the equalizer unit 2a (steps S4 and S5).

Using the selected equalizing characteristic, the output signal S2 of the amplifier 1 is equalized.

In the above embodiment, instead of the amplifier 1, other types of amplifiers may be used if they are equipped with DSP.

According to the acoustic apparatus of the present invention, the operability can be improved and an optimum sound field effect and sound effect can be easily obtained.

Furthermore, the acoustic apparatus of the present invention is simple in both hardware and software, and cost effective, and can be realized easily. .pa

What is claimed is:

1. An audio component system comprising:
   (A) an audio amplifier component located in a first audio component housing, including:
   (a) digital signal processing means for receiving a sound signal and adding reflecting and reverberating characteristics to said sound signal, according to a DSP sound processing data pattern specifying reflecting and reverberating characteristics, to generate a DSP sound signal;
   (b) manual selection means for receiving a manual user input selecting one of a predetermined group of DSP sound processing data patterns and generating a selection signal;
   (c) DSP control means comprising a first microprocessor and associated memory connected to said digital signal processing means and said manual selection means for storing a plurality of said DSP sound processing data patterns, receiving said selection signal, and controlling the digital signal processing means to implement the DSP sound processing data pattern selected by said manual user input; and
   (d) control signal generating means connected to said DSP control means for generating a control output specifying the selected DSP sound processing data pattern and transmitting said control output to a device separate from the audio amplifier component;
   (B) an equalizer component located in a second audio component housing separate from said first housing and including:
   (a) an equalizer connected to receive said DSP sound signal from the amplifier and process said DSP sound signal by selectively varying its frequency response characteristics according to a selected equalizing curve;
   (b) an equalizer control means comprising a second microprocessor and associated memory separate from said first microprocessor, for storing a plurality of data sets specifying equalizing curves in one-to-one correspondency with said plurality of sound processing data patterns of said digital signal processing means, receiving said control output specifying said selected DSP sound processing data pattern, and automatically synchronously controlling the equalizer to select an equalizing curve corresponding to the selected DSP sound processing data pattern; and
   (C) communication line means for transmitting said control output between said first microprocessor in said audio amplifier component and said second microprocessor in said equalizer component.

2. The audio component system of claim 1 further comprising synchronous mode selection means for selectively enabling and disabling the operation of said equalizer control means.

3. The audio component system of claim 2 wherein said synchronous mode selection means comprises a switch for activating and deactivating said equalizer control means.

* * * * *